United States Patent [19]
Shin et al.

[11] Patent Number: 5,702,568
[45] Date of Patent: Dec. 30, 1997

[54] METHOD OF FORMING A VIA HOLE OF A SEMICONDUCTOR DEVICE WITH SPIN-ON-GLASS FILM SEALED BY AN OXIDE FILM

[75] Inventors: Chan Soo Shin; Choon Hwan Kim, both of Kyungki-do, Rep. of Korea

[73] Assignee: Hyundai Electronics Industries Co., Ltd., Kyungki-do, Rep. of Korea

[21] Appl. No.: 668,845

[22] Filed: Jun. 24, 1996

[30] Foreign Application Priority Data

Jun. 24, 1995 [KR] Rep. of Korea ............. 95-17288

[51] Int. Cl.[6] ....................................... H01L 21/306
[52] U.S. Cl. ............................ 156/644.1; 156/653.1; 437/195; 437/228; 437/231; 437/238
[58] Field of Search ........................... 437/195, 228, 437/231, 238; 156/644.1, 653.1

[56] References Cited

U.S. PATENT DOCUMENTS 5,364,818  11/1994  Ouellet .................... 437/195
5,422,312  6/1995  Lee et al. ................. 437/195
5,437,763  8/1995  Huang ...................... 216/18
5,506,177  4/1996  Kishimoto et al. ........... 437/195

OTHER PUBLICATIONS

Wolf et al Silicon Processing for the VLSI Era, vol. 2 Process Integration, pp. 229-236, 1986.

*Primary Examiner*—R. Bruce Breneman
*Assistant Examiner*—Anita Alanko
*Attorney, Agent, or Firm*—Fish & Richardson P.C.

[57] ABSTRACT

The present invention discloses a method of forming a via hole of a semiconductor device, which includes the steps of: forming a plurality of first metal wires on a wafer; after coating a SOG film on the first oxide film, forming a groove in the SOG film using a mask in which a via hole contact is formed, the size of which is bigger than that of the real via hole to be formed in it; performing a process of filling up completely the groove portion (a two-step process for the first embodiment or a one-step process for the second embodiment); and forming a via hole using a contact mask the size of which is the same as that of the real via hole.

1 Claim, 4 Drawing Sheets

METHOD OF FORMING A VIA HOLE OF A SEMICONDUCTOR DEVICE WITH SPIN-ON-GLASS FILM SEALED BY AN OXIDE FILM

FIELD OF THE INVENTION

The present invention relates to a method of forming a via hole of a semiconductor device, and more particularly to a method of forming a via hole of a semiconductor device which is capable of improving the reliability of the device, by improving the problems generating from SOG (Spin On Glass), which is used as an interlayer insulating film so as to insulate multi-layer metal wires from one another.

BACKGROUND OF THE INVENTION

With the elevated integration density of semiconductor devices, metal wires consist of a multi-layer structure, and SOG or $O_2$-TEOS oxide films are commonly used as metal interlayer insulating films, which insulate these multi-layer metal wires from one another. These days, SOG, having good gap filling characteristics, is used as an interlayer insulating film so as to fill the gap between the metal wires. This, however, degrades the reliability of the semiconductor device due to moisture and other defect factors generating from the SOG in a subsequent process after the SOG is formed.

When forming a second metal wire after the formation of a via hole, moisture and a foreign substance generated from the SOG cause via contact resistance to increase. To solve this problem, there are two conventional methods; a degassing process for removing moisture within the SOG by maintaining the wafer at the temperature of 450° C. for a given time before the deposition of the second metal wire, and a process of forming a spacer on the side walls of the via hole after the formation of the via hole to prevent moisture generating from the SOG. In addition, when forming a via hole, SOG is over-etched due to the differences in the properties of matter between SOG and metal interlayer insulating films upon a dry etching. Over-etching causes mis-shapen etching profile in which SOG on the side walls of the via hole is depressed. There is a problem when forming the second metal wire through an aluminum sputtering process, whereby it is difficult to fill the via hole.

SUMMARY OF THE INVENTION

Accordingly, it is an object of the present invention to provide a method of forming a via hole of a semiconductor device, which is capable of improving the reliability of the device by solving the problems due to SOG, which is exposed at the side walls of the via hole when forming a second metal wire.

To accomplish the above object, a method of forming a via hole of a semiconductor device, comprising the steps of: providing a wafer having a plurality of metal wires; forming a first oxide film on the wafer including the metal wires; coating a first SOG film on the first oxide film; forming a groove by over etching a portion of the first SOG film enough to expose a portion of the first oxide film; forming a second thin oxide film on the first SOG film in which the groove is formed; filling up the groove by coating the second SOG film on the second oxide film; and forming a via hole by sequentially etching a portion of the second SOG film, the second oxide film, and the first oxide film, wherein the width of the via hole is smaller than that of the groove, and then removing a remained portion of the second SOG film.

A method of forming a via hole of a semiconductor device, comprising the steps of: providing a wafer having a plurality of metal wires; forming a first oxide film on the wafer including the plurality of metal wires; coating a SOG film on the first oxide film; forming a groove by over etching a portion of the SOG film enough to expose a portion of the first oxide film; forming a second oxide film on the SOG film in which the groove is formed, so as to fill up the groove; and forming a via hole by sequentially etching a portion of the second oxide film and the first oxide film, wherein the width of the via hole is smaller than that of the groove.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

FIG. 1A through FIG. 1F show sectional views of a device for explaining a method of forming a via hole of a semiconductor device in accordance with a first embodiment of the present invention.

Figure 1A:
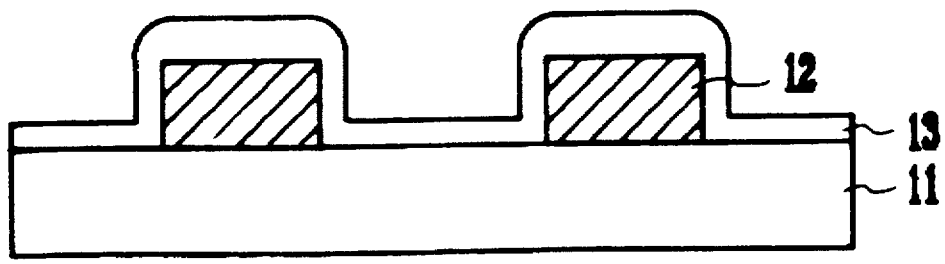
FIG. 1A through FIG. 1F show sectional views of a device for explaining a method of forming a via hole of a semiconductor device in accordance with a first embodiment of the present invention.

Referring to FIG. 1A, there is shown a sectional view of the device in which a plurality of first metal wires 12 are formed on a wafer 11 and a first oxide film 13 is formed thinly on the wafer 11 including the plurality of first metal wires 12.

Figure 1B:
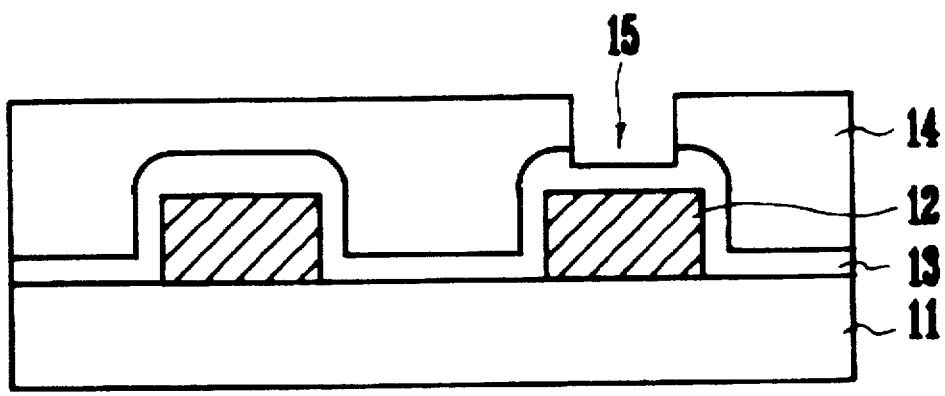

Referring to FIG. 1B, there is shown a sectional view of the device in which, in order to fill the gap efficiently between the plurality of first metal wires 12, a first SOG film 14 having good gap filling characteristics, is coated thickly on the first oxide film 13, and a groove 15 is formed by over etching the first SOG film 14 through a photolithography process using a mask.

Figure 1C:
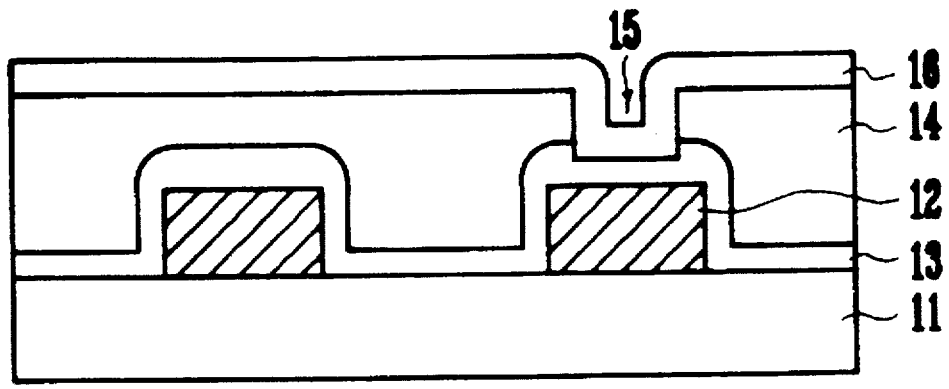

Referring to FIG. 1C, there is shown a sectional view of the device in which a second oxide film 16 is formed on the first SOG film 14 in which the groove 15 is formed. Then, as the second oxide film 16 is formed thinly enough not to fill the groove 15, the surface of the second oxide film 16 at the groove 15 portion is curved. As explained above, if at this state the via hole is formed, it is extremely difficult to completely remove the photoresist within the contact hole during a photolithography process to form a photoresist pattern and also the etching profile is mis-shapen when carrying out a dry etching to form a via hole.

Figure 1D:
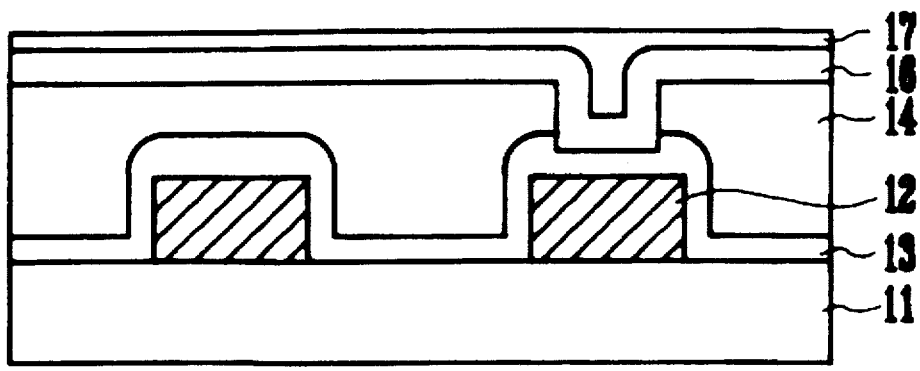

Referring to FIG. 1D, there is shown a sectional view of the device in which a second SOG film 17 is coated on the second oxide film 16 so as to solve the above problem. Thus the groove 15 portion is completely filled up.

Figure 1E:
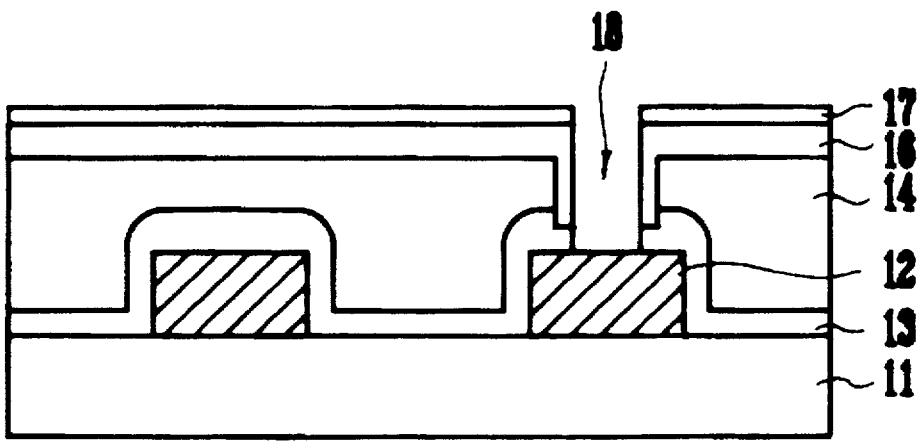

Referring to FIG. 1E, there is shown a sectional view of the device in which a via hole 18 is formed by sequentially etching the second SOG film 17, the second oxide film 16 and the first oxide film 13 through a photolithography process using a mask. The width of the via hole 18 is smaller than that of the groove 15.

Figure 1F:
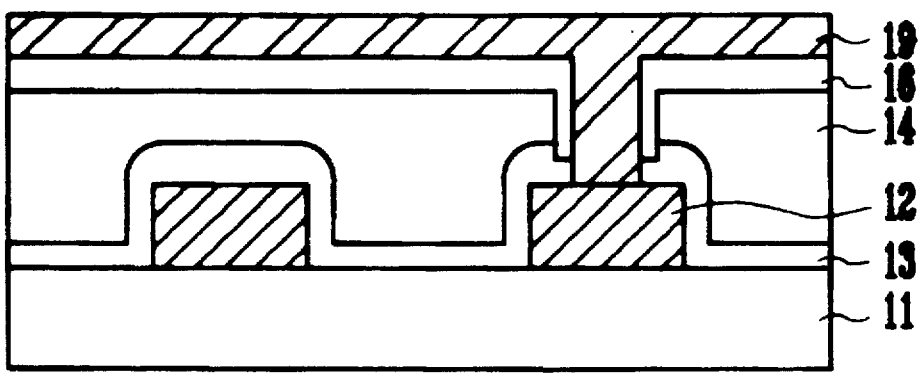

Referring to FIG. 1F, there is shown a sectional view of the device in which a second metal wire 19 connected to the first metal wire 12 is formed on a metal interlayer insulating film (consisting of the first oxide film 13, the first SOG film 14 and the second oxide film 16) after the second SOG film 17 is completely removed.

FIG. 2A through FIG. 2E show sectional views of a device for explaining a method of forming a via hole of a semiconductor device in accordance with a second embodiment of the present invention.

Figure 2A:
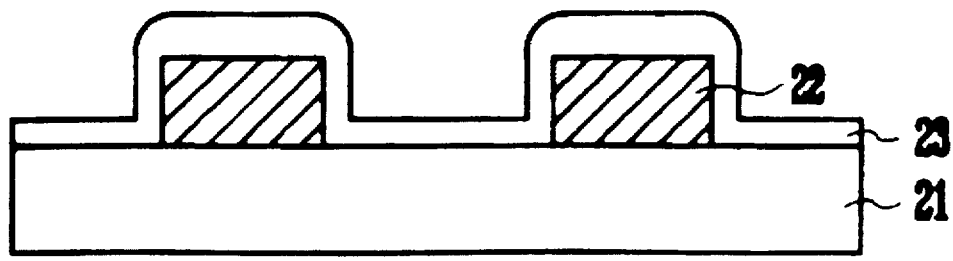
FIG. 2A through FIG. 2E show sectional views of a device for explaining a method of forming a via hole of a semiconductor device in accordance with a second embodiment of the present invention.

Referring to FIG. 2A, there is shown a sectional view of the device in which a plurality of first metal wires 22 are formed on a wafer 21 and a first oxide film 23 is formed thinly on the wafer 21 including the plurality of first metal wires 22.

Figure 2B:
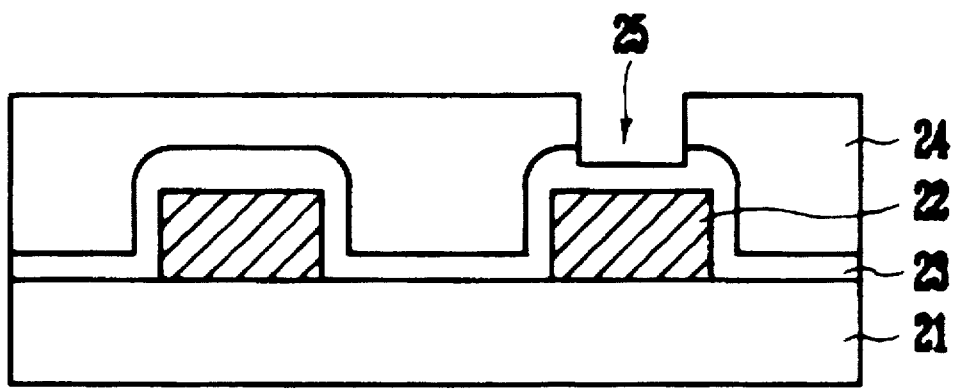

Referring to FIG. 2B, in order to fill the gap efficiently between the plurality of first metal wires 22, a SOG film 24 having good gap filling characteristics, is coated thickly on the first oxide film 23. A groove 25 is formed by over etching the SOG film 24 through a photolithography process using a mask.

Figure 2C:
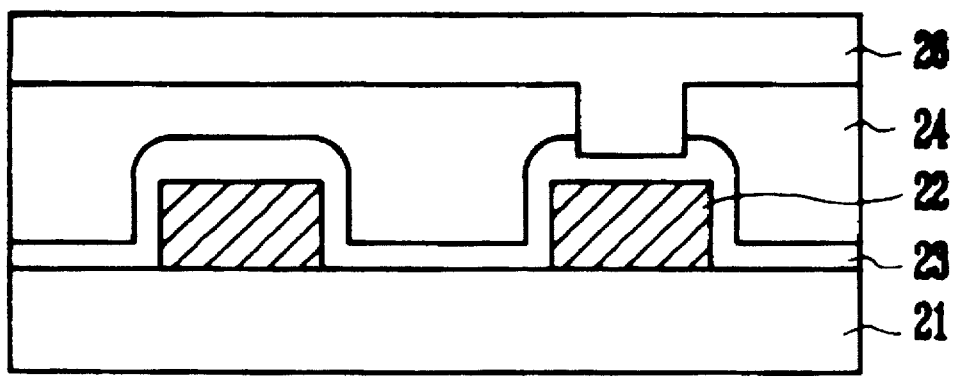

Referring to FIG. 2C, there is shown a sectional view of the device in which a second oxide film 26 is formed on the SOG film 24 in which the groove 25 is formed. The second oxide film 26 is formed thickly enough to fill the groove 25.

Figure 2D:
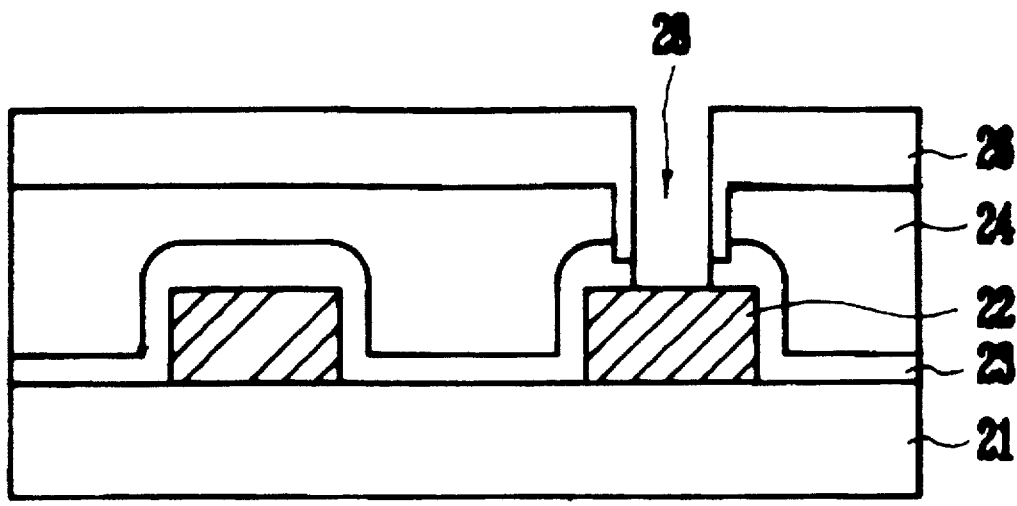

Referring to FIG. 2D, there is shown a sectional view of the device in which a via hole 28 is formed by sequentially etching the second oxide film 26 and the first oxide film 23 through a photolithography process using the mask. The width of the via hole 28 is smaller than that of the groove 25.

Figure 2E:
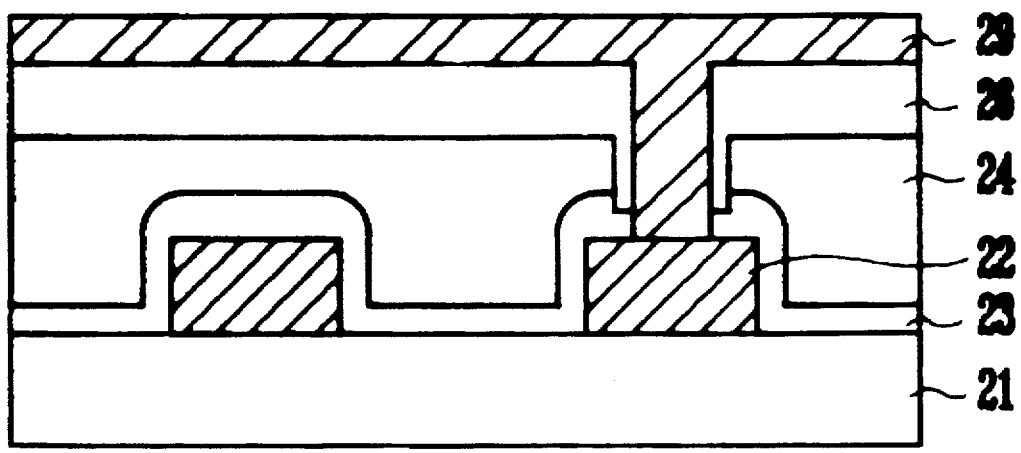

Referring to FIG. 2E, there is shown a sectional view of the device in which a second metal wire 29 connected to the first metal wire 22 is formed on a metal interlayer insulating film (consisting of the first oxide film 23, the SOG film 24 and the second oxide film 26).

As mentioned above, the present invention not only can form a via hole without exposing the SOG film at the side walls of the via hole resulting in a via hole having a preferred etching profile because the SOG film is not exposed when forming the via hole by means of a dry etching process, but can solve the problems in the photolithography process which can arise when the second oxide film among the metal interlayer insulating films is thin, as with the first embodiment.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of forming a via hole of a semiconductor device, comprising the steps of:

providing a wafer having a plurality of metal wires;

forming a first oxide film on said wafer including said metal wires;

coating a first SOG film on said first oxide film;

forming a groove of a first cross sectional width by overetching a portion of said first SOG film enough to expose a portion of said first oxide film;

forming a second thin oxide film on said first SOG film in which said groove is formed;

filling up said groove by coating a second SOG film on said second oxide film;

to form a via hole having a second cross sectional width smaller than said first cross sectional of said groove; and removing a remaining portion of said second SOG film.

* * * * *